United States Patent [19]

Noonan et al.

[11] 4,419,437
[45] Dec. 6, 1983

[54] IMAGE-FORMING COMPOSITIONS AND ELEMENTS CONTAINING IONIC POLYESTER DISPERSING AGENTS

[75] Inventors: John M. Noonan; Raymond W. Ryan; James F. Houle, all of Rochester, N.Y.

[73] Assignee: Eastman Kodak Company, Rochester, N.Y.

[21] Appl. No.: 233,526

[22] Filed: Feb. 11, 1981

[51] Int. Cl.³ ............................................. G03C 1/68
[52] U.S. Cl. .................................... 430/270; 430/275; 430/281; 430/285; 430/286; 430/292; 430/338; 430/340; 430/169; 430/176; 430/192; 430/524; 430/631
[58] Field of Search ............... 430/559, 631, 169, 176, 430/192, 270, 292, 275, 524, 281, 285, 286, 338, 340; 106/308 M

[56] References Cited

U.S. PATENT DOCUMENTS 3,546,180 12/1970 Caldwell et al. .
3,920,457 11/1975 Cunningham et al. .
3,929,489 12/1975 Arcesi et al. .
4,139,390 2/1979 Rauner et al. .
4,141,733 2/1979 Guild .
4,243,430 1/1981 Sperry et al. ................. 106/308 M

FOREIGN PATENT DOCUMENTS 1470059 4/1977 United Kingdom .

OTHER PUBLICATIONS

Research Disclosure, Publication 12730, Nov. 1974, pp. 26–27.

Primary Examiner—Won H. Louie, Jr.
Attorney, Agent, or Firm—A. P. Lorenzo

[57] ABSTRACT

Substantially amorphous polyesters containing ionic moieties are useful to uniformly disperse particulate pigments in dispersions, image-forming compositions and elements, e.g. lithographic compositions and elements. Such polyesters reduce pigment agglomerations and improve dispersion stability in such dispersions and compositions and coatings prepared therefrom.

14 Claims, No Drawings

IMAGE-FORMING COMPOSITIONS AND ELEMENTS CONTAINING IONIC POLYESTER DISPERSING AGENTS

FIELD OF THE INVENTION

This invention relates to image-forming compositions, e.g. image-forming compositions useful in lithographic printing plates, photoresists and similar products. In particular, it relates to stabilized image-forming compositions which comprise dispersions of particulate pigment in a radiation sensitive composition. This invention also relates to image-forming elements, e.g. lithographic elements, having image-forming layers of such compositions.

BACKGROUND OF THE INVENTION

Image-forming elements which provide images by selective removal of image-forming layers are known. Generally, image formation in such elements results from selective exposure of the image-forming layer(s) to actinic radiation and subsequent development. Such elements are known as radiation sensitive elements and include lithographic plates, photoresists, relief plates, color-proofing elements and color filter arrays.

Radiation sensitive compositions useful in such elements are generally categorized as being either positive-working or negative-working. Positive-working compositions are used to form radiation sensitive coatings which can be selectively solubilized in a suitable solvent in radiation-struck areas, thus leaving behind a positive image. In a common form, positive-working compositions can be coated from solvents and developed using aqueous solutions.

Negative-working compositions can be prepared from polymers which crosslink and become insolubilized in radiation-struck areas. Such compositions are ordinarily coated from organic solvents. A developer, which can be aqueous or organic solvent based depending upon the nature of the radiation sensitive compositions, is used to remove the unexposed portions of the coating to form a negative image.

In many image-forming elements, e.g. lithographic plates and photoresists, it is desirable to have either a visible indication of exposure or a visible image before development. This is convenient in step and repeat exposure operations where the elements are stored for some time between exposure and development, or where it is desirable to evaluate the image before development. To provide this visibility, it is frequently the practice to include in the image-forming composition a dye which is capable of either printout or bleachout on exposure of the coating prepared from the composition. A wide variety of indicator dyes useful for this purpose are known, as described for example in U.S. Pat. No. 3,920,457 (issued Nov. 18, 1975 to Cunningham et al).

In other instances, it is desirable to have a visible indication of the image after development. This can be useful, for instance, in what are known as "proofing" or inspection operations or after final development of lithographic plates or photoresists. The dyes described above are not usually suitable for providing image visibility after development because they are frequently partially or totally removed during development. Hence, workers in the art typically use suitable pigments to provide a readily visible image after exposure and development.

The pigments used in image-forming elements to provide such post-development image visibility are colorants of very small particle size which usually exist in very small agglomerates. When dispersed in a composition comprising suitable solvents, binders and addenda commonly used to formulate radiation sensitive compositions, these small agglomerates are attracted to each other and clump together and form larger agglomerates. When these agglomerates become large enough, they settle out of the dispersion over time. If not broken up or redispersed, such agglomerates can plug coating equipment and cause streaks, nonuniform pigment density and other defects in the coatings and otherwise ruin the resulting product. Conventional milling techniques are generally inadequate to break up the agglomerates to harmless sizes or to keep the pigment dispersed. Hence, workers in the art have resorted to expensive and time-consuming redispersion techniques that keep pigments dispersed until they are mixed with radiation sensitive materials and coated.

This dispersion problem hs been mitigated to a limited degree by use of dispersing agents, e.g. commercially-available surfactants, such as charged and non-charged fluorocarbons, phosphate esters, condensed naphthalene sulfonates, dialkyl sodium sulfosuccinates; zinc, copper, iron and calcium naphthenates; calcium ligno sulfonates; and fatty acids.

U.S. Pat. No. 3,929,489 (issued Dec. 30, 1975 to Arcesi et al) and U.S. Pat. No. 3,920,457 (issued Nov. 18, 1975 to Cunningham et al) describe certain radiation sensitive compositions useful in the preparation of lithographic plates. These compositions comprise particular photocrosslinkable polyesters having anionic moieties. Generally, pigments are added to these compositions while dispersed in suitable solvents. The dispersing agents described hereinabove, and particularly the fluorocarbon surfactants, are used to disperse the pigments and minimize pigment agglomeration.

However, it has been evident that the dispersing agents fail to reduce pigment agglomeration in the dispersions to an acceptable extent. When mixed with the radiation sensitive compositions, the resulting coating compositions have unacceptably-large pigment agglomerates, poor coatability and considerable pigment density variations. The coating compositions cannot be stored for long periods of time without becoming increasingly unstable, meaning clumps of pigment settle out. Yet, such pigments cannot be redispersed in such compositions because the high shear needed for redispersion would undesirably crosslink the photocrosslinkable polyester.

Hence, there is a need in the art for stabilized particulate pigment dispersions useful in image-forming compositions and coatings which are substantially free of pigment agglomerates.

SUMMARY OF THE INVENTION

In accordance with this invention, we have unexpectedly found that substantially amorphous polyesters having ionic moieties provide sufficient dispersing power to stabilize pigment particles in dispersions and image-forming compositions. Such compositions can be stored for long periods of time prior to coating without undesirable pigment agglomeration. The coating problems, density variations and other defects experienced with prior art dispersing agents are substantially avoided by the practice of this invention.

In addition, we have unexpectedly found that the substantially amorphous polyesters described herein reduce the viscosities of the pigment dispersions so that ball milling or other dispersing techniques can be carried out with less than a conventional amount of solvent and minimal waste (i.e. less dispersion adheres to milling equipment).

In one aspect, this invention provides an image-forming composition. This composition comprises a radiation sensitive polymeric composition, a particulate pigment and a substantially amorphous polyester having at least one ionic moiety. Such polyester is present in the image-forming composition in an amount effective to uniformly disperse the pigment in the image-forming composition.

In another aspect, this invention provides an image-forming element comprising a support having thereon an image-forming layer. Such layer comprises a radiation sensitive composition, a particulate pigment and, as a dispersing agent, the substantially amorphous polyester described in the preceding paragraph.

In still another aspect, this invention provides a process for preparing an image-forming composition comprising a radiation sensitive polymeric composition, an organic solvent, a particulate pigment and the substantially amorphous polyester described hereinabove as a dispersing agent. Such process comprises dispersing the pigment in the solvent by means of the dispersing agent, and combining the radiation sensitive polymeric composition with the resulting dispersion.

DETAILED DESCRIPTION OF THE INVENTION

The dispersing agents useful in the compositions and elements of this invention are substantially amorphous polyesters having ionic moieties. The term "substantially amorphous" means that the polyesters are less than about 5%, and preferably less than about 3%, crystalline as determined by X-ray diffraction analysis. As is well known, when subjected to X-rays, a crystalline material exhibits a coherent scattering due to its crystalline order and has many sharp maximum peaks in its diffraction pattern. The substantially amorphous polyesters useful in this invention, however, exhibit incoherent X-ray scattering and have a broad band with few or no sharp peaks. The amorphous nature of the polyesters described herein is essential to enable them to provide the dispersing ability needed to prevent undesirable pigment agglomeration.

The polyesters useful in this invention preferably have an inherent viscosity of at least 0.1, when measured at 25° C. in a 1:1 (weight) solvent mixture of phenol and chlorobenzene using 0.25 grams of polymer per deciliter of solution. More preferably, the inherent viscosity is in the range of from about 0.1 to about 1, and most preferably from about 0.15 to about 0.8.

It is also preferred that the polyesters described herein have a glass transition temperature (Tg) within the range of from about −60° to about 120° C., and more preferably from about −40° to about 100° C. The glass transition temperatures can be determined by any suitable technique, such as differential scanning colorimetry as disclosed in *Techniques and Methods of Polymer Evaluation*, Vol. 2, Marcel Dekker, Inc., N.Y., 1970.

The substantially amorphous polyesters useful in this invention comprise dicarboxylic acid recurring units typically derived from dicarboxylic acids or their functional equivalents and diol recurring units typically derived from diols. Generally, such polyesters are prepared by reacting one or more diols with one or more dicarboxylic acids or their functional equivalents (e.g. anhydrides, diesters or diacid halides), as illustrated in Polyester Preparations 1–9 which follow. Such diols, dicarboxylic acids and their functional equivalents are sometimes referred to in the art as polymer precursors. It should be noted that, as known in the art, carbonylimino groups can be used as linking groups rather than carbonyloxy groups. This modification is readily achieved by reacting one or more diamines or amino alcohols with one or more dicarboxylic acids or their functional equivalents. Mixtures of diols and diamines can be used if desired.

Conditions for preparing the polyesters useful in this invention are known in the art. The polymer precursors are condensed in a ratio of at least 1 mole, and preferably at least 1.1 moles, of diol for each mole of dicarboxylic acid in the presence of a suitable catalyst at a temperature of from about 125° to about 300° C. Condensation pressure is typically from about 0.1 mm Hg to about one or more atmospheres. Low-molecular weight by-products are removed during condensation, e.g. by distillation or another suitable technique. The resulting condensation polymer is polycondensed under appropriate conditions to form a polyester. Polycondensation is usually carried out at a temperature of from about 150° to about 300° C. and a pressure very near vacuum, although higher pressures can be used.

The amorphous polyesters described herein contain at least one ionic moiety, which can also be referred to as an ionic group or radical. Such polyesters are sometimes referred to as "ionomers" or "polyester ionomers." Such ionic moieties can be provided by either ionic diol recurring units or ionic dicarboxylic acid recurring units, but preferably by the latter. Such ionic moieties can be anionic or cationic in nature, but preferably, they are anionic. Exemplary ionic groups include carboxylic acid, sulfonic acid, quaternary ammonium and disulfonylimino and their salts and others known to a worker of ordinary skill in the art.

In a preferred embodiment of this invention, the amorphous polyesters comprise from about 2 to about 25 mole percent, based on total moles of dicarboxylic acid recurring units, of ionic dicarboxylic acid recurring units.

Ionic dicarboxylic acids found to be particularly useful in the practice of this invention are those having units represented by the formula:

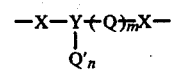

wherein each of m and n is 0 or 1 and the sum of m and n is 1; each X is carbonyl; Q has the formula:

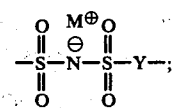

Q' has the formula:

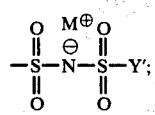

Y is a divalent aromatic radical, such as arylene (e.g. phenylene, naphthalene, xylylene, etc.) or arylidyne (e.g. phenenyl, naphthylidyne, etc.); Y' is a monovalent aromatic radical, such as aryl, aralkyl or alkaryl (e.g. phenyl, p-methylphenyl, naphthyl, etc.), or alkyl having from 1 to 12 carbon atoms, such as methyl, ethyl, isopropyl, n-pentyl, neopentyl, 2-chlorohexyl, etc., and preferably from 1 to 6 carbon atoms; and M is a solubilizing cation and preferably a monovalent cation such as an alkali metal or ammonium cation.

Exemplary preferred dicarboxylic acids and functional equivalents from which such ionic recurring units are derived are
3,3'-[(sodioimino)disulfonyl]dibenzoic acid; 3,3'-[(potassioimino)disulfonyl]dibenzoic acid,
3,3'-[(lithioimino)disulfonyl]dibenzoic acid;
4,4'-[(lithioimino)disulfonyl]dibenzoic acid;
4,4'-[(sodioimino)disulfonyl]dibenzoic acid;
4,4'-[(potassioimino)disulfonyl]dibenzoic acid; 3,4'-[(lithioimino)disulfonyl]dibenzoic acid;
3,4'-[(sodioimino)disulfonyl]dibenzoic acid;
5-[4-chloronaphth-1-ylsulfonyl(sodioimino)sulfonyl]isophthalic acid; 4,4'-[(potassioimino)disulfonyl]dinaphthoic acid;
5-[p-tolylsulfonyl(potassioimino)sulfonyl]isophthalic acid; 4-[p-tolylsulfonyl(sodioimino)sulfonyl]-1,5-naphthalenedicarboxylic acid;
5-[n-hexylsulfonyl(lithioimino)sulfonyl]isophthalic acid; 2-[phenylsulfonyl(potassioimino)sulfonyl]terephthalic acid and functional equivalents thereof. These and other dicarboxylic acids useful in forming preferred ionic recurring units are described in U.S. Pat. No. 3,546,180 (issued Dec. 8, 1970 to Caldwell et al) the disclosure of which is incorporated herein by reference.

Ionic dicarboxylic acid recurring units can also be derived from 5-sodiosulfobenzene-1,3-dicarboxylic acid, 5-sodiosulfocyclohexane-1,3-dicarboxylic acid, 5-(4-sodiosulfophenoxy)benzene-1,3-dicarboxylic acid, 5-(4-sodiosulfophenoxy)cyclohexane-1,3-dicarboxylic acid, similar compounds and functional equivalents thereof and others described in U.K. Patent Specification No. 1,470,059 (published Apr. 14, 1977).

The amorphous polyesters preferably comprise from about 75 to about 98 mole percent, based on total moles of dicarboxylic acid recurring units, of dicarboxylic acid recurring units which are nonionic in nature. Such nonionic units can be derived from any suitable dicarboxylic acid or functional equivalent which will condense with a diol as long as the resulting polyester is substantially amorphous. Preferably, such units have the formula:

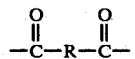

wherein R is saturated or unsaturated divalent hydrocarbon. Preferably, R is alkylene of 2 to 20 carbon atoms, (e.g. ethylene, propylene, neopentylene, 2-chlorobutylene, etc.); cycloalkylene of 5 to 10 carbon atoms, (e.g. cyclopentylene, 1,3-cyclohexylene, 1,4-cyclohexylene, 1,4-dimethylcyclohexylene, etc.); or arylene of 6 to 12 carbon atoms, (e.g. phenylene, xylylene, etc.). More preferably, R is alkylene of 2 to 10 carbon atoms.

Such recurring units are derived from, for example, phthalic acid, isophthalic acid, terephthalic acid, malonic acid, succinic acid, glutaric acid, adipic acid, suberic acid, and 1,3-cyclohexane dicarboxylic acid and functional equivalents thereof. Dicarboxylic acids which have moieties which are sensitive to actinic radiation are also useful. Exemplary radiation sensitive dicarboxylic acids or functional equivalents thereof are described in U.S. Pat. No. 3,929,489 (issued Dec. 30, 1975 to Arcesi et al) the disclosure of which is incorporated herein by reference.

The dicarboxylic acid recurring units are linked in a polyester by recurring units derived from difunctional compounds capable of condensing with a dicarboxylic acid or a functional equivalent thereof. Such difunctional compounds include diols of the formula HO—R$^1$—OH wherein R$^1$ is a divalent aliphatic, alicyclic or aromatic radical of from 2 to 12 carbon atoms and includes hydrogen and carbon atoms and optionally, ether oxygen atoms.

Such aliphatic, alicyclic and aromatic radicals include alkylene, cycloalkylene, arylene, alkylenearylene, alkylenecycloalkylene, alkylenebisarylene, cycloalkylenebisalkylene, arylenebisalkylene, alkylene-oxyalkylene, alkylene-oxy-arylene-oxy-alkylene, arylene-oxy-alkylene, alkylene-oxy-cycloalkylene-oxy-alkylene, etc. Preferably, R$^1$ contains an ether linkage, such as in cycloalkylene-oxy-alkylene or alkylene-oxy-alkylene.

Exemplary diols include ethylene glycol, diethylene glycol, triethylene glycol, 1,3-propanediol, 1,4-butanediol, 2-methyl-1,5-pentanediol, neopentyl glycol, 1,4-cyclohexanedimethanol, 1,4-bis(β-hydroxyethoxy)-cyclohexane, quinitol, norcamphanediols, 2,2,4,4-tetraalkylcyclobutane-1,3-diols, p-xylene diol and Bisphenol A.

In a preferred embodiment, the substantially amorphous polyesters described herein comprise diol recurring units of either of the formulae

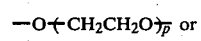

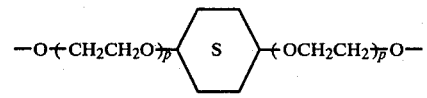

wherein p is an integer from 1 to 4. Such recurring units are present in the polyesters in an amount of at least 50 mole percent, and most preferably from about 50 to 100 mole percent, based on total moles of diol recurring units.

Amorphous polyesters particularly useful in the practice of this invention include poly[1,4-cyclohexylenedi(oxyethyene) 3,3'-[(sodioimino)disulfonyl]dibenzoate-co-succinate (5:95 molar ratio)], poly[1,4-cyclohexylenedi(oxy-ethylene)-co-ethylene (75:25 molar ratio) 3,3'-[(potassioimino)disulfonyl]dibenzoate-co-azelate (10:90 molar ratio)], poly[1,4-cyclohexylenedi(oxyethylene)3,3'-[(sodioimino)disulfonyl]-dibenzoate-co-adipate (95:5 molar ratio)] and poly[1,4-cyclohexylenedi(oxyethylene)3,3'-[(sodioimino)-disulfonyl]dibenzoate-co-3,3'-(1,4-phenylene)-dipropionate (20:80 molar ratio)].

The substantially amorphous polyesters described herein are utilized in the image-forming compositions of this invention in an amount effective to uniformly disperse particulate pigments in or throughout the composition or a coated layer thereof. Such uniform dispersion results in substantially agglomerate-free compositions and layers. Preferably, the polyesters are present in an amount in the range of from about 1 to about 10 percent based on pigment weight. Mixtures of amorphous polyesters can be used if desired.

Typically, particulate pigments are dispersed in a solvent using conventional techniques and procedures. Either conventional ball milling or pebble milling equipment can be used. About one half of the volume of the mill is filled with milling materials, e.g. steel balls, flint pebbles, procelain cylinders, etc. Pigments, solvent, the amorphous polyester dispersing agents described herein, binders, thickeners and any other addenda are then put into the ball mill in suitable amounts. The solids content of the resulting paste-like dispersion is chosen to provide the optimum viscosity during milling. After a suitable milling time, the dispersion is usually diluted with solvent to lower the viscosity for handling and to reduce waste (i.e. increase yield).

The radiation sensitive polymeric compositions useful in the image-forming compositions and elements of this invention comprise a suitable radiation sensitive material and, typically, a polymeric binder and other suitable addenda. If desired, the radiation sensitive material can be a photocrosslinkable polymer which also acts as a binder. The radiation sensitive composition can be considered as a continuous phase in which a discontinuous phase (i.e. a particulate pigment) is uniformly dispersed by the substantially amorphous polyesters described herein. In other words, the radiation sensitive composition is "homogeneous," uniform or similar throughout because of the substantially uniform dispersal of the discontinuous phase throughout the continuous phase. The pigment dispersion is combined with the radiation sensitive material and other addenda in any suitable way.

Radiation sensitive materials useful in this invention are well known in the art, and include silver halide emulsions as described in *Research Disclosure*, publication 17643, paragraph XXV, Dec., 1978 and references noted therein; quinone diazides (polymeric and non-polymeric), as described in U.S. Pat. No. 4,141,733 (issued Feb. 27, 1979 to Guild) and references noted therein; light sensitive polycarbonates, as described in U.S. Pat. No. 3,511,611 (issued May 12, 1970 to Rauner et al) and references noted therein; diazonium salts, diazo resins, cinnamal-malonic acids and functional equivalents thereof and others described in U.S. Pat. No. 3,342,601 (issued Sept. 19, 1967 to Houle et al) and references noted therein; and light sensitive polyesters, polycarbonates and polysulfonates, as described in U.S. Pat. No. 4,139,390 (issued Feb. 13, 1979 to Rauner et al) and references noted therein.

Particularly useful radiation sensitive materials are photocrosslinkable polymers, such as polyesters, containing the photosensitive group

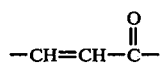

as an integral part of the polymer backbone. For example, preferred photocrosslinkable polymers are polyesters prepared from one or more compounds represented by the following formulae:

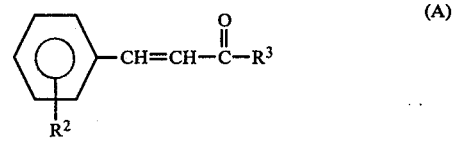

wherein $R^2$ is one or more alkyl of 1 to 6 carbon atoms, aryl of 6 to 12 carbon atoms, aralkyl of 7 to 20 carbon atoms, alkoxy of 1 to 6 carbon atoms, nitro, amino, acrylic, carboxyl, hydrogen or halo and is chosen to provide at least one condensation site; and $R^3$ is hydroxy, alkoxy of 1 to 6 carbon atoms, halo or oxy if the compound is an acid anhydride. A preferred compound is p-phenylene diacrylic acid or a functional equivalent thereof. These and other useful compounds are described in U.S. Pat. No. 3,030,208 (issued Apr. 17, 1962 to Schellenberg et al); U.S. Pat. No. 3,702,765 (issued Nov. 14, 1972 to Laakso); and U.S. Pat. No. 3,622,320 (issued Nov. 23, 1971 to Allen), the disclosure of which are incorporated herein by reference.

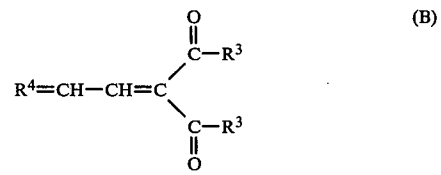

$R^3$ is as defined above, and $R^4$ is alkylidene of 1 to 4 carbon atoms, aralkylidene of 7 to 16 carbon atoms, or a 5- to 6-membered heterocyclic ring. Particularly useful compounds of formula (B) are cinnamylidenemalonic acid, 2-butenylidenemalonic acid, 3-pentenylidenemalonic acid, o-nitrocinnamylidenemalonic acid, naphthylallylidenemalonic acid, 2-furfurylideneethylidenemalonic acid and functional equivalents thereof. These and other useful compounds are described in U.S. Pat. No. 3,674,745 (issued July 4, 1972 to Philipot et al), the disclosure of which is incorporated herein by reference.

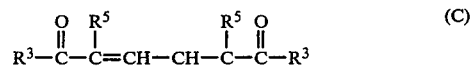

$R^3$ is as defined above; and $R^5$ is hydrogen or methyl. Particularly useful compounds of formula (C) are trans, trans-muconic acid, cis, trans-muconic acid, cis, cis-muconic acid, α,α'-cis, trans-dimethylmuconic acid, α,α'-cis, cis-dimethylmuconic acid and functional equivalents thereof. These and other useful compounds are described in U.S. Pat. No. 3,615,434 (issued Oct. 26, 1971 to McConkey), the disclosure of which is incorporated herein by reference.

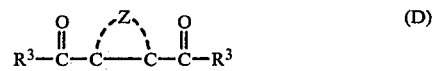

$R^3$ is as defined above; and Z represents the atoms necessary to form an unsaturated, bridged or unbridged carbocyclic nucleus of 6 or 7 carbon atoms. Such nucleus can be substituted or unsubstituted. Particularly useful compounds of formula (D) are 4-cyclohexene-1,2-dicarboxylic acid, 5-norbornene-2,3-dicarboxylic acid, hexachloro-5[2:2:1]-bicycloheptene-2,3-dicarboxylic acid and functional equivalents thereof. These and other useful compounds are described in Canadian Pat. No. 824,096 (issued Sept. 30, 1969 to Mench et al), the disclosure of which is incorporated herein by reference.

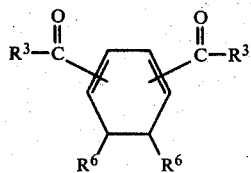

$R^3$ is as defined above; and $R^6$ is hydrogen, alkyl of 1 to 12 carbon atoms, cycloalkyl of 5 to 12 carbon atoms or aryl of 6 to 12 carbon atoms. $R^6$ can be substituted, where possible, with such substituents as do not interfere with the condensation reaction, such as halo, nitro, aryl, alkoxy, aryloxy, etc. The carbonyl groups are attached to the cyclohexadiene nucleus meta or para to each other, and preferably para. Particularly useful compounds of formula (E) are 1,3-cyclohexadiene-1,4-dicarboxylic acid, 1,3-cyclohexa-diene-1,3-dicarboxylic acid, 1,5-cyclohexadiene-1,4-dicarboxylic acid and functional equivalents thereof. These and other useful compounds are described in Belgian Pat. No. 754,892 (issued Oct. 15, 1970), the disclosure of which is incorporated herein by reference.

A preferred photocrosslinkable polyester useful in the composition and elements of this invention is poly[1,4-cyclohexylenebis(oxyethylene)-1,4-phenylenediacrylate].

The pigments useful in the image-forming compositions and elements of this invention are particulate materials having a maximum average particle size less than about 3 micrometers in their major dimension. Preferably, these pigments are colorants providing a visible coloration to an image before or after development of the element. Useful pigments are well known in the art and include titanium dioxide, zinc oxide, copper phthalocyanines, halogenated copper phthalocyanines, quinacridine, and colorants such as those sold commercially under such trade names as Monastral Red B. The pigments are generally present in the compositions in an amount within the range of from about 1 to about 50 percent (by weight) based on total dry composition weight. Preferred amounts are within the range of from about 5 to about 20 percent (by weight).

Radiation sensitivity of the radiation sensitive polymeric composition can be enhanced by incorporating therein one or more spectral sensitizers. Suitable spectral sensitizers include anthrones, nitro sensitizers, triphenylmethanes, quinones, cyanine dyes, naphthones, pyrylium and thiapyrylium salts, furanones, anthraquinones, 3-ketocoumarins, thiazoles, thiazolines, naphthothiazolines, quinalizones, and others described in U.S. Pat. No. 4,139,390 and references noted therein. Such sensitizers can be present in the compositions in effective sensitizing amounts easily determined by one of ordinary skill in the art.

Where a photocrosslinkable polymer is used in this invention, that polymer need not be directly crosslinked in response to actinic radiation. Rather, they can be crosslinked by employing radiation-responsive sensitizers which act as crosslinking agents, such as ketone-type and azide-type sensitizers. Examples of such sensitizers are benz(a)anthracene-7,12-dione, 4,4'-bis(dimethylamino)benzophenone, 4,4'-tetraethyldiaminodiphenyl ketone, dibenzalacetone and 4,4'-bis(dimethylamino)benzophenone imide. These sensitizers can be present in the compositions in effective sensitizing amounts easily determined by one of ordinary skill in the art.

In addition to sensitizers, a number of other addenda can be present on the image-forming compositions and ultimately be a part of the coated image-forming elements.

It is frequently desirable to add print out or indicator dyes to the compositions to provide a colored print out image prior to development. Useful dyes for such a purpose include monoazo, diazo, methine, anthraquinone, triarylmethane, thiazine, xanthene, phthalocyanine, azine, cyanine and leuco dyes as described, for example, in U.S. Pat. Nos. 3,929,489 and 4,139,390 and references noted therein. The latter reference also describes useful azide sensitizers for colorless leuco print out dyes. Such dyes and sensitizers are present in amounts readily determined by a person of ordinary skill in the art.

Other addenda useful in the compositions of this invention include polyester stabilizers and antioxidants as described, for example, in U.S. Pat. Nos. 3,929,489 and 4,101,326 (issued July 18, 1978 to Barkey); reductone leuco dye stabilizers as described, for example, in U.S. Pat. No. 3,920,457 (issued Nov. 19, 1975 to Cunningham et al); surfactants; anti-scumming agents; and other known in the art. As is well understood in the art, the above addenda are present in only a minor amount in the image-forming composition. Individual addenda are typically limited to amounts less than about 5 percent, by weight, of the dried image-forming layer.

Binders or extenders can also be incorporated into the image-forming compositions. Such binders or extenders are usually present in an amount within the range of from about 1 to about 50 percent (by weight) based on total dry composition weight. Suitable binders include styrene-butadiene copolymers; silicone resins; styrene-alkyd resins; silicone-alkyd resins; soya-alkyd resins; poly(vinyl chloride); poly(vinylidene chloride); vinylidene chloride-acrylonitrile copolymers; poly(vinyl acetate); vinyl acetate-vinyl chloride copolymers; poly(vinyl acetals), such as poly(vinyl butyral); polyacrylic and -methacrylic esters, such as poly(methyl methacrylate), poly(n-butyl methacrylate) and poly(isobutyl methacrylate); polystyrene; nitrated polystyrene; polymethylstyrene; isobutylene polymers; polyesters, such as poly(ethylene-co-alkaryloxyalkylene terephthalate); phenol-formaldehyde resins; ketone resins; polyamides; polycarbonates; polythiocarbonates, poly(ethylene 4,4'-isopropylidenediphenylene terephthalate); copolymers of vinyl haloarylates and vinyl acetate such as poly(vinyl m-bromobenzoate-co-vinyl acetate); ethyl cellulose, poly(vinyl alcohol), cellulose acetate, cellulose nitrate, chlorinated rubber and gelatin. Methods of making binders or extenders of this type are well known in the prior art. A typical resin of the type contemplated for use is Piccolastic A50 TM, commercially available from Hercules, Inc., Wilmington, Del. Other types of binders which can be used include such materials as paraffin and mineral waxes.

Particularly useful image-forming compositions contain at least one film-forming polymeric resin in addition to a crosslinkable polymer and the amorphous polyesters described herein. These additional polymeric resins are typically not radiation sensitive, although mixtures of radiation sensitive resins can be employed and are usually selected from those resins which are soluble in the coating solvent. The amount of resin employed can be varied, depending upon the resin, the crosslinkable polymer, the coating solvent, and the coating method and application chosen. Useful results can be obtained using image-forming compositions containing up to 5 parts of resin per part of crosslinkable polymer on a weight basis. Generally preferred coating compositions are those that contain from 0.05 to 1.0 part resin per part of crosslinkable polymer on a weight basis.

Exemplary film-forming resins useful as additives in the compositions of this invention are phenolic resins, such as novolac and resole resins. These resins are particularly useful in improving the resistance of coatings to etchants when the coating composition is used as a photo-resist composition. Where it is desired to control ink acceptance of the imaging area produced from the composition, as in lithographic and relief plates, it can be desirable to incorporate resins, such as epoxy resins; hydrogenated rosin; poly(vinyl acetals); and acrylic polymers and copolymers, such as poly(methyl methacrylate), polystyrene, acrylates of the type disclosed in British Pat. No. 1,108,383, poly(alkylene oxides) and poly(vinyl alcohol). The crosslinkable polymers are also generally compatible with linear polyesters.

Solvents which are inert toward the components of the image-forming compositions are usually employed to dissolve the components and thereby mix them together and to provide fluid compositions for convenient and ready application of the compositions to suitable supports. Among the solvents which may be employed in preparing the compositions of this invention are amides such as formamides, such as N,N-dimethylformamide, N,N-dimethylacetamide; alcohols such as methanol, ethanol, 1-propanol, 2-propanol, butanol; ketones such as acetone and 2-butanone; esters such as ethylacetate, ethylbenzoate, etc., ethers such as tetrahydrofuran and dioxane; chlorinated aliphatic hydrocarbons such as methylene chloride, 1,1-dichloroethane and 1,2-dichloroethane; aromatic hydrocarbons such as benzene and toluene; and other common solvents such as dimethyl sulfoxide, chlorobenzene and various mixtures of the solvents. Preferred solvents are 1,2-dichloroethane and methylene chloride.

When the compositions are coated and dried on a suitable support, typical dry coating thicknesses can be, for example, from about 0.05 to 10.0 micrometers or greater. Thicknesses of from 0.1 to 5.0 micrometers are preferred for lithographic plates.

In applying the image-forming composition to a support, the composition can be sprayed, brushed, applied by a roller or immersion coater, flowed over the surface, picked up by immersion, impregnated or spread by other means. Elements thus formed are dried at room temperature, under vacuum or at elevated temperature.

Suitable support materials can be chosen from among a variety of materials which do not directly chemically react with the image-forming composition. Such support materials include fiber base materials such as paper, polyethylene-coated paper, polypropylene-coated paper, parchment, cloth, etc.; sheets and foils of such metals as aluminum, copper, magnesium and zinc; glass and glass coated with such metals as chromium, chromium alloys, steel, silver, gold and platinum; synthetic resin and polymeric materials such as poly(alkyl acrylates), e.g., poly(methyl methacrylate), polyester film base, e.g., poly(ethylene terephthalate), poly(vinyl acetals), polyamides, e.g., nylon and cellulose ester film base, e.g., cellulose nitrate, cellulose acetate, cellulose acetate propionate, cellulose acetate butyrate and the like.

Specific support materials which are useful in forming printing plates—particularly lithographic printing plates—include metal supports such as zinc, anodized aluminum, grained aluminum, copper and specially prepared metal and paper supports; superficially hydrolyzed cellulose ester films; and polymeric supports such as polyolefins, polyesters and polyamides. A metal support is preferred.

The supports can be preliminarily coated (i.e., before receipt of the image-forming composition) with known subbing layers such as copolymers of vinylidene chloride and acrylic monomers (e.g., acrylonitrile and methyl acrylate) and unsaturated dicarboxylic acids such as itaconic acid; carboxymethyl cellulose; gelatin; polyacrylamide; and similar polymer materials.

The support can also carry, as a filter or antihalation layer, dyed polymer layer which absorbs the exposing radiation after it passes through the image-forming layer and eliminates unwanted reflection from the support. A yellow dye in a polymeric binder, such as one of the polymers referred to above as suitable subbing layers, is an especially effective antihalation layer when ultraviolet radiation is employed as the exposing radiation.

The elements prepared as described above are exposed to a pattern of actinic radiation (e.g. ultraviolet light) from a suitable radiation source and the image is formed directly on the support. The exposure can be by contact printing techniques, by lens projection, by reflex, by bireflex, from an image-bearing original, or by any other known technique.

The exposed image-forming elements of this invention can be developed by flushing, soaking, swabbing or otherwise treating the image-forming layer with a solution (hereinafter referred to as a developer) which selectively solubilizes (i.e. removes) the unexposed areas of the image-forming layer in negative-working materials, or the exposed areas in positive-working materials. The developer for positive-working materials is typically an aqueous alkaline solution having a pH in the range of from about 9 to 14. Basicity can be imparted to the developer by the incorporation of soluble inorganic basic compounds such as alkali metal hydroxides, phosphates, sulfates, silicates, carbonates and the like as well as combinations thereof. Alternatively or in combination, basic, soluble organic substances such as amines, e.g., triethanol amine, diethyleneimine and diethylaminoethanol, can be incorporated.

In a preferred form the developer includes a miscible combination of water and alcohol as a solvent system. The proportions of water and alcohol can be varied widely but are typically within the range of from 20 to 80 percent by volume water and from 80 to 20 percent by volume alcohol, based on the total developer volume. Most preferably, the water content is maintained within the range of from 40 to 60 percent by volume, based on total volume, with the remainder of the solvent system consisting essentially of alcohol. Any alcohol or combination of alcohols that dissolves unexposed image-forming composition during development and is miscible with water in the proportions chosen for use can be employed. Exemplary of useful alcohols are glycerol, benzyl alcohol, 2-phenoxyethanol, 1,2-propanediol, sec-butyl alcohol and ethers derived from alkylene glycols, i.e. dihydroxy poly(alkylene oxides), e.g., dihydroxy poly(ethylene oxide) and dihydroxy poly(propylene oxide).

Lactone developers useful for negative-working materials and of the type described in U.S. Pat. No. 3,707,373 (issued Dec. 26, 1972 to Martinson et al) can also be used with the litho plates of this invention.

It is recognized that the developer can, optionally, contain additional addenda. For example, the developer can contain dyes or pigments. Where the developer is being used to develop the image of a lithographic plate, it can be advantageous to incorporate into the developer anti-scumming or anti-blinding agents, as is well recognized in the art.

The element can then be treated in any known manner consistent with its intended use. For example, printing plates are typically subjected to desensitizing etches. Where the developed radiation sensitive coating layer forms a resist layer, the element is typically subjected to acidic or basic etchants and to plating baths.

The following preparations and examples are included for a further understanding of the invention.

Polyester Preparation 1

Poly[1,4-cyclohexylenedi(oxyethylene) 3,3'-[(sodioimino)disulfonyl]dibenzoate, sodium salt-co-succinate (5:95 molar ratio)], an amorphous polyester useful as a dispersing agent in the compositions of this invention, was prepared in the following manner.

1,4-Bis($\beta$-hydroxyethoxy)cyclohexane (35.1 g, 0.172 mole), dimethyl succinate (16.5 g, 0.095 mole) and dimethyl 3,3'-[(sodioimino)disulfonyl]dibenzoate (2.2 g, 0.005 mole) were put into a 100 ml flask which was immersed in a 235° C. salt bath. Nitrogen gas was introduced into the flask to provide an inert atmosphere. When the mixture had become a homogeneous melt (about 5 min.), one drop of tetraisopropylorthotitanate catalyst was added. The volatile by-products of polycondensation were distilled off at 235° C. and atmospheric pressure for four hours. The pressure was then reduced to 0.05 mm Hg and the polymer was stirred until it had an inherent viscosity of 0.4 (measured at 25° C. in 1:1 phenol:chlorobenzene, by weight, solvent mixture and 0.25 g polymer per deciliter of solution). The resulting amorphous polyester was then removed from the flask.

Polyester Preparations 2-8

Several other amorphous polyesters were prepared in the manner described in Preparation 1. In all cases, the diol precursor was 1,4-bis($\beta$-hydroxyethoxy)cyclohexane, and the ionic diacid precursor was dimethyl 3,3'-[(sodioimino)disulfonyl]dibenzoate. Table I below lists the nonionic diacid precursor, amount of ionic diacid precursor and resulting inherent viscosity for each polyester prepared.

TABLE I

| Preparation | Nonionic Diacid (Mole %)* | Ionic Diacid (Mole %)* | Inherent Viscosity** |
|---|---|---|---|
| 2 | diethyl succinate (95) | 5 | 0.54 |
| 3 | diethyl succinate (80) | 20 | 0.44 |
| 4 | diethyl succinate (85) | 15 | 0.25 |
| 5 | diethyl succinate (95) | 5 | 0.53 |
| 6 | diethyl succinate (90) | 10 | 0.60 |
| 7 | dimethyl adipate (95) | 5 | 0.48 |
| 8 | 1,4-diethylenecyclohexanedicarboxylic acid (80) | 20 | 0.25 |

*based on total moles of diacid or functional equivalent
**as measured at 25° C. and 0.25 g/dl solution of 1:1 (wt) phenol:chlorobenzene Preparation 9

Poly[ethylene-co-1,4-cyclohexylenedi(oxyethylene) (55:45 molar ratio) 3,3'-[(sodioimino)disulfonyl]dibenzoate-co-sebacate (5:95 molar ratio)] was prepared in the following manner.

Dimethyl sebacate (437.6 g, 1.9 moles), 3,3'-[(sodioimio)disulfonyl]dibenzoate (43.5 g, 0.1 mole), 1,4-bis(-hydroxyethoxy)cyclohexane (357.2 g, 1.8 moles) and excess ethylene glycol (136.4 g, 2.2 moles) were reacted under a nitrogen gas atmosphere in the presence of tetraisopropylorthotitanate (25 ml standard solution, 100 ppm titanium) catalyst, pentaerythritol tetrakis[3-(3,5-di-t-butyl-4-hydroxyphenyl)propionate] (0.45 g) antioxidant and tri-(2-ethylhexyl)phosphate (0.35 g) stabilizer. The volatile by-products of polycondensation were distilled off for 6.25 hours as the temperature was raised from 180° to 236° C. and the pressure decreased to 0.25 mm Hg. The resulting amorphous polyester had an inherent viscosity of 0.71 (in 1:1 phenol:chlorobenzene).

Dispersion Preparations 1-8

Pigment dispersions for use in lithographic plate compositions were prepared in the following manner:

Monastral Red B ™ pigment (1 kg.) and an appropriate amorphous polyester (25-200 g.) were added to a quantity of 1,2-dichloroethane sufficient to give about 20% (by weight) pigment solids. The resulting mixture was ball milled in a conventional 3 gallon (11.4 liters) ball mill containing flint pebbles for 120-144 hours. Additional 1,2-dichloroethane was then added to the resulting dispersion in a quantity sufficient to give about 11% (by weight) pigment solids. The viscosity of each dispersion was about 50 centipoise. The yield of dispersion upon discharge from the ball mill was about 95%.

These dispersions contained the amorphous polyesters described in the respective Preparations 1-8 (e.g. Dispersion 1 contained the polyester of Preparation 1). No agglomeration was observed in these dispersions and very little of the dispersions was left in the ball mill.

Several control dispersions were similarly prepared except that Fluorad FC98 ™, an anionic fluorocarbon surfactant, commercially-available from 3M Company, Minneapolis, Minn., was used in place of the amorphous polyester. The amount of Fluorad FC98 ™ used varied from about 2 to about 5 percent based on dry pigment weight.

After ball milling the dispersions for about 144-168 hours, a quantity of 1,2-dichloroethane was added to each dispersion in an amount sufficient to give a 7.5% (by weight) percent solids. The resulting dispersion viscosities were in the range of from 1200 to 1400 centipoise, and the resulting yield was about 70 to 85% upon discharge from the mill. Thus, a considerable amount of each dispersion was wasted.

EXAMPLES 1–8

Image-Forming Compositions and Elements

Lithographic coating compositions were prepaed from the pigment dispersions described in Dispersion Preparations 1–8. Similar coating compositions were prepared from the Control dispersions.

About 36.3 g of each pigment dispersion was used with the following ingredients to form an image-forming composition:

| | |
|---|---|
| poly[1,4-cyclohexylenebis(oxyethylene) 1,4-phenylenediacrylate]photosensitive polymer | 10 g. |
| Piccolastic A-50 TM resin binder | 3.4 g. |
| 2,6-di-t-butyl-p-cresol antioxidant | 0.4 g. |
| 2-benzoylmethylene-1-ethylnaphtho-[1,2-d]thiazoline | 0.5 g. |
| leuco-propyl violet dye | 0.48 g. |
| 2-azido-1-(carbo-n-butoxymethyl-carbamyl)benzimidazole | 0.96 g. |
| dihydroanhydro piperidinohexose reductone | 0.048 g. |
| Modaflo TM surfactant (available from Monsanto, St. Louis, Missouri) | 0.04 g. |
| 1,2-dichloroethane solvent | quantity sufficient to give 478 g. total |

Each image-forming composition of Examples 1–8 was stable and free of pigment agglomeration. The mean pigment particle size in each coating composition was about 0.2 micrometers. In contrast, the Control compositions were unstable and had many pigment agglomerates, some of which were several micrometers in size. The average pigment particle size in the Control compositions was from 1 to 3 micrometers.

Fresh and aged (i.e. stored for 7 days at 50° C. and 50% relative humidity) samples of each image-forming composition were coated from a drum coater onto conventional anodized aluminum supports subbed with a coating of carboxymethyl cellulose and zinc acetate. The solvent was then removed leaving a dry image-forming coating on the subbed support having a coverage of about 1.1 g/m².

Each resulting image-forming element was exposed to a 2000 watt NuArc pulsed xenon light source for about 60 seconds through a Kodak TM Control Scale T-14 sensitivity guide.

The exposed plates were processed with Kodak Polymatic TM negative developer (components listed below), treated with a lithographic plate finisher (components listed below) and dried.

| Polymatic TM Developer: | |
|---|---|
| 4-butyrolactone | 1000 ml |
| Zonyl A TM (ethylene oxide-ester condensate from DuPont) | 10 ml |
| Methyl abietate | 10 ml |
| Staybellite TM resin (available from Hercules Chemical Co., New York, New York) | 1 g |
| Glycerol | 100 ml |
| Phosphoric acid | 25 ml |
| Triethanolamine | 12.5 ml |
| Distilled water | 100 ml |
| Finisher: | |
| phosphoric acid (85%) | 43 ml |
| poly(vinyl pyrollidone) | 13 g |
| sodium hexametaphosphate | 10 g |
| aluminum nitrate | 5 g |
| sodium hydroxide | 19 g |
| distilled water | 160 ml |

The following results were observed:

Prior to coating, the Control image-forming compositions exhibited considerable pigment-solvent separation after two to three days storage. In other words, the pigment agglomerated and did not stay dispersed in the composition. When these compositions were coated onto aluminum supports, many pigment agglomerates were evident, giving the resulting element a rough or granular appearance. Consequently, pigment density was nonuniform over the entire elements.

In contrast, the image-forming compositions of Examples 1–8 exhibited excellent stability prior to coating. No pigment agglomerates could be observed in these compositions after 7 days of storage. After 28 days of storage, the compositions of Examples 1–8 contained only a very small amount of sediment. No pigment agglomerates were observed in the image-forming elements after coating. The resulting elements were smooth in appearance and had uniform pigment density after exposure and development.

EXAMPLES 9 AND 10

Two image-forming elements of this invention were prepared as in Examples 1–8 using the amorphous polyesters of Preparations 1 and 7, respectively, for Examples 9 and 10. 2-Azido-1-(carbo-n-butoxymethylcarbamyl)-benzimidazole was replaced with N-methoxy-4-phenylpyridinium tetrafluoroborate (0.48 g). Another Control element was similarly prepared using Fluorad FC98 TM as the pigment dispersing agent. All elements were exposed to actinic radiation, developed and finished as in Examples 1–8.

The Control image-forming composition showed severe pigment agglomeration as almost all the pigment settled out of solution within a few minutes of mixing the pigment dispersion with the other components. After coating the composition on a support, the resulting element had a rough and grainy appearance, and was nonuniform in pigment density after exposure and development.

In contrast, the image-forming compositions of Examples 9 and 10 were free of pigment agglomerates (both fresh and aged). The resulting coated elements exhibited smooth surfaces and uniform pigment density after exposure and development.

EXAMPLES 11 AND 12

Two image-forming elements of this invention were prepared as described in Examples 9 and 10. About 3.4 grams of each of the amorphous polyesters of Preparations 1 and 7 were added to the respective coating compositions in place of the Piccolastic A50 TM resin binder. The resulting coating compositions were free of pigment agglomeration after several weeks of storage. The additional amorphous polyester in the coating compositions appears to provide additional stabilization above that obtained with the amorphous polyester used as pigment dispersing agent, especially when N-methoxy-4-phenyl pyridinium tetrafluoroborate is present.

Image-forming elements were prepared using the described coating compositions. The resulting image-forming coatings were smooth, free of pigment agglomerates and exhibited uniform pigment density after exposure and development.

This invention has been described in detail with particular reference to certain preferred embodiments thereof, but it will be understood that variations and modifications can be effected within the spirit and scope of the invention.

What is claimed is:

1. An image-forming composition comprising:
a radiation sensitive polymeric composition,
a particulate pigment, and
a substantially amorphous polyester comprising (1) dicarboxylic acid recurring units of which from about 2 to about 25 mole percent, based on total moles of said dicarboxylic acid recurring units, are ionic dicarboxylic acid recurring units of the formula

wherein each of m and n is 0 or 1 and the sum of m and n is 1; each X is carbonyl; Q has the formula:

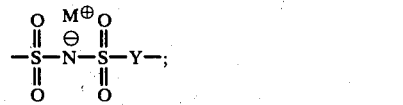

Q' has the formula:

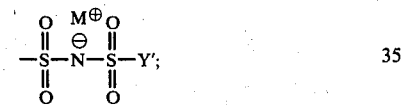

Y is a divalent aromatic radical; Y' is a monovalent aromatic radical or alkyl; and M is a monovalent cation; and the remainder of said dicarboxylic acid recurring units are nonionic and have the formula

wherein R is alkylene, cycloalkylene or arylene; and (2) diol recurring units derived from diols of the formula HO—R$^1$—OH wherein R$^1$ is a divalent aliphatic, alicyclic or aromatic radical having from 2 to 12 carbon atoms and containing an ether linkage,
said polyester being present in said image-forming composition in an amount effective to uniformly disperse said pigment in said image-forming composition.

2. The image-forming composition of claim 1 wherein said substantially amorphous polyester is present in an amount of from about 1 to about 10 percent based on pigment weight.

3. The image-forming composition of claim 1 wherein said substantially amorphous polyester has an inherent viscosity of from about 0.1 to about 1, when measured at 25° C. in a 1:1 (weight) solvent mixture of phenol and chlorobenzene.

4. In an image-forming element comprising a support having thereon an image-forming layer, said layer comprising a radiation sensitive polymeric composition, a particulate pigment and a dispersing agent for uniformly dispersing said pigment in said layer,
the improvement wherein said dispersing agent is a substantially amorphous polyester comprising (1) dicarboxylic acid recurring units of which from about 2 to about 25 mole percent, based on total moles of said dicarboxylic acid recurring units, are ionic dicarboxylic acid recurring units of the formula

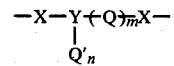

wherein each of m and n is 0 or 1 and the sum of m and n is 1; each X is carbonyl; Q has the formula:

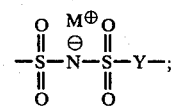

Q' has the formula:

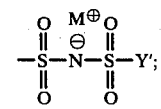

Y is a divalent aromatic radical; Y' is a monovalent aromatic radical or alkyl; and M is a monovalent cation; and the remainder of said dicarboxylic acid recurring units are nonionic and have the formula

wherein R is alkylene, cycloalkylene or arylene; and (2) diol recurring units derived from diols of the formula HO—R$^1$—OH wherein R$^1$ is a divalent aliphatic, alicyclic or aromatic radical having from 2 to 12 carbon atoms and containing an ether linkage.

5. The image-forming element of claim 4 which is a lithographic plate.

6. The image-forming element of claim 4 wherein said support is a metal support.

7. The image-forming element of claim 4 wherein said radiation sensitive polymeric composition comprises a photocrosslinkable polymer.

8. The image-forming element of claim 4 wherein said substantially amorphous polyester is present in said layer in an amount of from about 1 to about 10 percent based on pigment weight.

9. The image-forming element of claim 4 wherein said polyester comprises aliphatic diol recurring units having either of the formulae

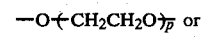

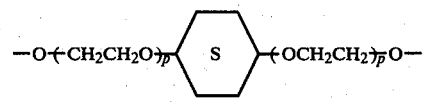

wherein p is an integer from 1 to 4.

10. The image-forming element of claim 9 wherein said aliphatic diol recurring units are present in said polyester in an amount of at least 50 mole percent based on total moles of diol recurring units.

11. In a lithographic element comprising a metallic support having thereon a radiation sensitive, image-forming layer, said layer comprising a photocrosslinkable polymer, a particulate pigment and a dispersing agent for uniformly dispersing said pigment in said layer, the improvement wherein said dispersing agent is a substantially amorphous polyester, said polyester comprising (1) dicarboxylic acid recurring units of which from about 2 to about 25 mole percent, based on total moles of said dicarboxylic acid recurring units, are ionic dicarboxylic acid recurring units of the formula:

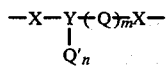

wherein each of m and n is 0 or 1 and the sum of m and n is 1; each X is carbonyl; Q has the formula:

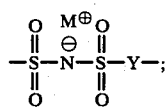

Q' has the formula:

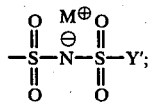

Y is a divalent aromatic radical; Y' is a monovalent aromatic radical or alkyl; and M is a monovalent cation; and the remainder of said dicarboxylic acid recurring units are nonionic and have the formula

where R is alkylene, cycloalkylene or arylene; and
(2) aliphatic diol recurring units having either of the formulae $-O\text{+CH}_2\text{CH}_2\text{O}\text{+}_{\overline{p}}$ or

wherein p is an integer from 1 to 4.

12. The lithographic element of claim 11 wherein said polyester is present in said layer in an amount of from about 1 to about 10 percent based on pigment weight.

13. In a process for preparing an image-forming composition comprising a radiation sensitive polymeric composition, an organic solvent, a particulate pigment and a dispersing agent, said process comprising (1) dispersing said pigment in said solvent by means of said dispersing agent to form a pigment dispersion, and (2) combining said radiation sensitive polymeric composition with said pigment dispersion, the improvement wherein said dispersing agent is a substantially amorphous polyester and is added to said image-forming composition in an amount effective to uniformly disperse said pigment in said image-forming composition; said polyester comprising (1) dicarboxylic acid recurring units of which from about 2 to about 25 mole percent, based on total moles of said dicarboxylic acid recurring units, are ionic dicarboxylic acid recurring units of the formula:

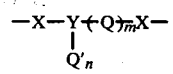

wherein each of m and n is 0 or 1 and the sum of m and n is 1; each X is carbonyl; Q has the formula:

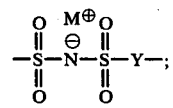

Q' has the formula:

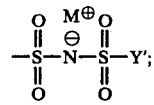

Y is a divalent aromatic radical; Y' is a monovalent aromatic radical or alkyl; M is a monovalent cation; and the remainder of said dicarboxylic acid recurring units are nonionic and have the formula

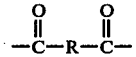

wherein R is alkylene, cycloalkylene or arylene; and (2) diol recurring units derived from diols of the formula HO—$R^1$—OH wherein $R^1$ is a divalent aliphatic, alicyclic or aromatic radical having from 2 to 12 carbon atoms and containing an ether linkage.

14. The process of claim 13 wherein said polyester is added to said image-forming composition in an amount of from about 1 to about 10 percent based on pigment weight.

* * * * *